US012696778B2

(12) United States Patent (10) Patent No.: US 12,696,778 B2
Yoon et al. (45) Date of Patent: Jul. 28, 2026

(54) SEMICONDUCTOR PACKAGE INCLUDING CONNECTING PADS

(71) Applicant: Samsung Electronics Co., Ltd., Suwon-si (KR)

(72) Inventors: Yae Jung Yoon, Hwaseong-si (KR); Eung Kyu Kim, Yongin-si (KR); Min Jun Bae, Hwaseong-si (KR); Kyoung Lim Suk, Suwon-si (KR); Seok Hyun Lee, Hwaseong-si (KR); Jae Gwon Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 871 days.

(21) Appl. No.: 17/853,205

(22) Filed: Jun. 29, 2022

(65) Prior Publication Data

US 2023/0068587 A1 Mar. 2, 2023

(30) Foreign Application Priority Data

Sep. 2, 2021 (KR) ........................ 10-2021-0117052

(51) Int. Cl.
*H10W 70/65* (2026.01)
*H10W 70/685* (2026.01)
(Continued)

(52) U.S. Cl.
CPC ......... *H10W 70/65* (2026.01); *H10W 70/685* (2026.01); *H10W 74/131* (2026.01);
(Continued)

(58) Field of Classification Search
CPC ............ H01L 23/49838; H01L 23/053; H01L 23/3157; H01L 23/49816; H01L 23/49822; H01L 24/16; H01L 25/18
See application file for complete search history.

(56) References Cited

U.S. PATENT DOCUMENTS 8,865,586 B2 10/2014 Wu et al.
9,343,442 B2 5/2016 Chen et al.
(Continued)

FOREIGN PATENT DOCUMENTS

KR 10-2016-0034755 A 3/2016
KR 10-2018-0125872 A 11/2018
KR 10-2020-0058129 A 5/2020
KR 10-2020-0068958 A 6/2020

OTHER PUBLICATIONS

Korean Office Action dated Aug. 21, 2025 issued in Korean Patent Application No. 10-2021-0117052.

*Primary Examiner* — Fernando L Toledo
*Assistant Examiner* — Ryan T. Fortin
(74) *Attorney, Agent, or Firm* — Harness, Dickey & Pierce, P.L.C.

(57) ABSTRACT

A semiconductor package including a passivation film, a mold layer on the passivation film, a connecting pad having a T shape, the T shape including a first portion and a second portion on the first portion, the first portion penetrating the passivation film, the second portion penetrating a part of the mold layer, a solder ball on the first portion of the connecting pad, an element on the second portion of the connecting pad, a wiring structure on the mold layer, the wiring structure including an insulating layer and a wiring pattern inside the insulating layer, and a semiconductor chip on the wiring structure may be provided.

20 Claims, 11 Drawing Sheets

(51) Int. Cl.

| | |
|---|---|
| *H10W 72/00* | (2026.01) |
| *H10W 72/20* | (2026.01) |
| *H10W 72/90* | (2026.01) |
| *H10W 74/10* | (2026.01) |
| *H10W 74/15* | (2026.01) |
| *H10W 76/15* | (2026.01) |
| *H10W 90/00* | (2026.01) |

(52) U.S. Cl.

CPC ........... *H10W 76/15* (2026.01); *H10W 90/00* (2026.01); *H10W 90/701* (2026.01); *H10W 72/072* (2026.01); *H10W 72/252* (2026.01); *H10W 72/952* (2026.01); *H10W 74/15* (2026.01); *H10W 90/724* (2026.01); *H10W 90/734* (2026.01)

(56) References Cited

U.S. PATENT DOCUMENTS

| | | | | |
|---|---|---|---|---|
| 9,653,445 | B2 | 5/2017 | Lin | |
| 10,157,852 | B2 | 12/2018 | Yu et al. | |
| 10,763,239 | B2 | 9/2020 | Chen et al. | |
| 2018/0145036 | A1* | 5/2018 | Kim | H01L 23/3128 |
| 2018/0218966 | A1* | 8/2018 | Choi | H01L 24/14 |
| 2018/0337136 | A1* | 11/2018 | Han | H01L 23/3135 |
| 2019/0013256 | A1* | 1/2019 | Lee | H01L 24/82 |
| 2019/0189549 | A1* | 6/2019 | Jo | H01L 23/5389 |
| 2020/0373244 | A1* | 11/2020 | Kang | H01L 23/552 |
| 2021/0020556 | A1 | 1/2021 | Wu et al. | |
| 2021/0050292 | A1* | 2/2021 | Kim | H01L 23/49838 |
| 2021/0118794 | A1* | 4/2021 | Ding | H01L 23/5383 |

* cited by examiner

SEMICONDUCTOR PACKAGE INCLUDING CONNECTING PADS

This application claims priority to Korean Patent Application No. 10-2021-0117052, filed on Sep. 2, 2021, and all the benefits accruing therefrom under 35 U.S.C. § 119, the disclosure of which is incorporated herein by reference in its entirety.

BACKGROUND

1. Field

The present disclosure relates to semiconductor packages.

2. Description of the Related Art

As semiconductor chips become smaller and lighter, a multi-chip package capable of performing high speed/broadband input/output (I/O) transmission is being studied. By implementing an electronic circuit including a semiconductor chip, a semiconductor chip package, or the like through a stacking technology, the degree of integration and the signal transmission characteristics may be improved.

On the other hand, when implementing the electronic circuit, it is necessary to appropriately place passive elements such as a capacitor together with a semiconductor chip. In the related art, although a structure in which the passive element is mounted on a bottom surface of a package has been mass-produced, there is a drawback in which with an increase in a length of an interconnection line between the semiconductor chip and the passive element, deterioration of the power transmission characteristics may occur relatively. Further, because an overall height of the semiconductor package increases due to mounting of the passive elements, there is a drawback in which the semiconductor package is difficult to be used for electronic products that are gradually becoming smaller. Therefore, it is necessary to develop a semiconductor package that may be easily applied to a three-dimensional integrated circuit, while minimizing the length of the interconnection line between the semiconductor chip and the capacitor.

SUMMARY

Some aspects of the present disclosure provide semiconductor packages having improved product reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an example embodiment, a semiconductor package includes a passivation film, a mold layer on the passivation film, a connecting pad having a T shape, the T shape including a first portion and a second portion on the first portion, the first portion penetrating the passivation film, the second portion penetrating a part of the mold layer, a solder ball on the first portion of the connecting pad, an element on the second portion of the connecting pad, a wiring structure on the mold layer, the wiring structure including an insulating layer and a wiring pattern inside the insulating layer, and a semiconductor chip on the wiring structure.

According to an example embodiment, a semiconductor package includes a connecting pad including a first portion and a second portion on the first portion, a passivation film wrapping the first portion of the connecting pad, a mold layer on the passivation film and wrapping the second portion of the connecting pad, a wiring structure on the mold layer and including an insulating layer and a wiring pattern inside the insulating layer, a post penetrating the mold layer and in contact with the second portion of the connecting pad and the wiring pattern, an element on the second portion of the connecting pad, the element including an element pad on an upper surface thereof, the element pad electrically connected to the wiring pattern, and a solder ball on the first portion of the connecting pad.

According to an example embodiment, a semiconductor package includes a passivation film, a first mold layer on the passivation film, a connecting pad having a T shape, the T shape including a first portion and a second portion on the first portion, the first portion penetrating the passivation film, a second portion penetrating a part of the first mold layer on the first portion, a first solder ball in contact with the first portion of the connecting pad, an element on the second portion of the connecting pad, an adhesive layer between the passivation film and the element, an element pad on the element, a first wiring structure on the first mold layer, the first wiring structure including a first insulating layer and a first wiring pattern inside the first insulating layer, the first wiring pattern electrically connected to the element pad, a post penetrating the first mold layer and electrically connected to the first wiring pattern and the second portion of the connecting pad, a first semiconductor chip on the first wiring structure and overlapping at least a part of the element, a second solder ball between the first wiring structure and the first semiconductor chip; and a second mold layer on the first wiring structure, the second mold layer covering the first wiring structure and the first semiconductor chip.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
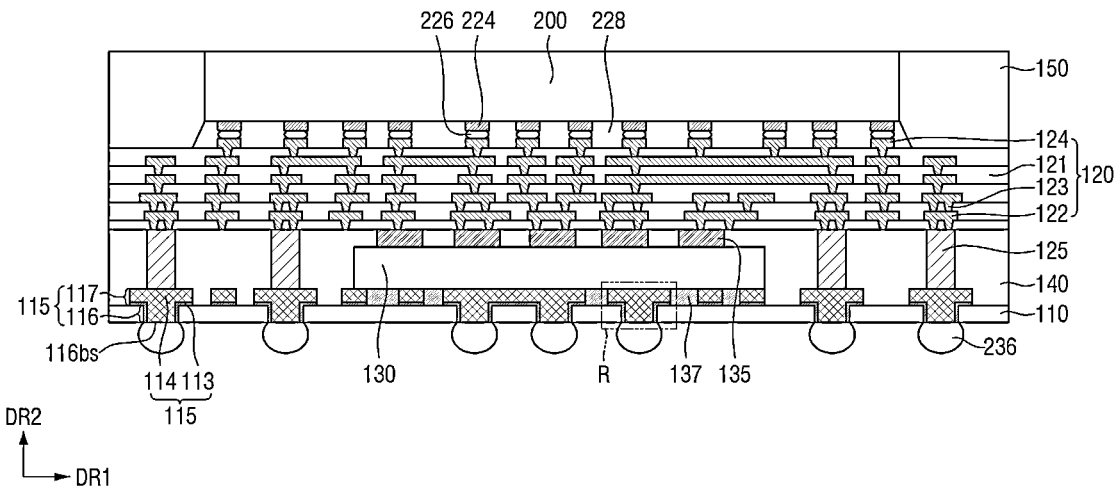
FIG. 1 is a diagram for explaining a semiconductor package according to an example embodiment
Figure 2A:
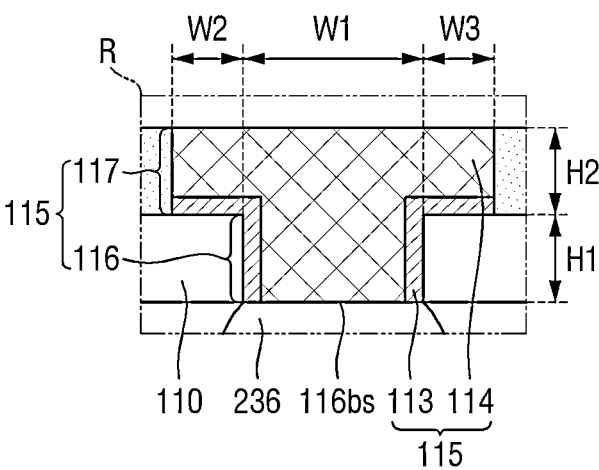
FIGS. 2a and 2b are enlarged views of a region R of FIG.
Figure 2B:
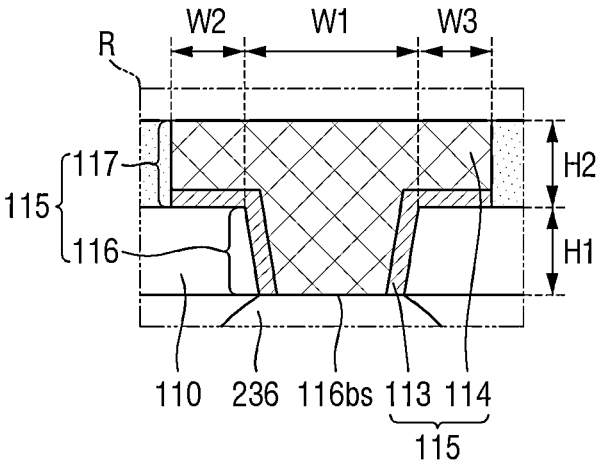

FIG. 1 is a diagram for explaining a semiconductor package according to an example embodiment. FIGS. 2*a* and 2*b* are enlarged views of a region R of FIG. 1.

Referring to FIGS. 1 and 2, the semiconductor package according to an example embodiment may include a passivation film 110, a connecting pad 115, a first wiring structure 120, an element 130, an element pad 135, an adhesive layer 137, a first mold layer 140, a second mold layer 150, a second solder ball 236, a first semiconductor chip 200, and a first solder ball 226.

The passivation film 110 may include, for example, a photo imageable dielectric (PID). The passivation film 110 may include epoxy or polyimide.

The connecting pad 115 may include a barrier film 113 and a filling film 114 on the barrier film 113. The barrier film 113 may extend along side surfaces and an upper surface of the passivation film 110. The barrier film 113 may extend between the filling film 114 and the passivation film 110. The barrier film 113 may not extend between the filling film 114 and a second solder ball 236. That is, at least a part of the lowermost surface of the filling film 114 may be exposed by the barrier film 113.

The barrier film 113 may include, for example, copper (Cu), nickel (Ni), titanium (Ti), titanium tungsten (TiW), titanium nitride (TiN), tantalum (Ta), tantalum nitride (TaN), chromium (Cr), aluminum (Al) or a combination thereof.

The filling film 114 may be, for example, but is not limited to, metal such as copper (Cu), aluminum (Al), tungsten (W), titanium (Ti), tantalum (Ta), indium (In), molybdenum (Mo), manganese (Mn), cobalt (Co), tin (Sn), nickel (Ni), manganese (Mg), rhenium (Re), beryllium (Be), gallium (Ga), and ruthenium (Ru) or alloys thereof.

In the semiconductor package according to some example embodiments, the barrier film 113 may include a substance having excellent adhesion to the passivation film 110. The passivation film 110 may include a photo imageable dielectric, the barrier film 113 may include nickel (Ni) or titanium (Ti), and the filling film 114 may include copper (Cu). The barrier film 113 may extend along the entire portion between the passivation film 110 and the filling film 114. Because the barrier film 113 is interposed between the passivation film 110 and the filling film 114, the adhesiveness between the passivation film 110 and the connecting pad 115 may be improved, and thus the interface reliability may be improved.

The connecting pad 115 may include a first portion 116, and a second portion 117 on the first portion 116. In some example embodiments, each of the first portion 116 and the second portion 117 may include the barrier film 113 and the filling film 114.

The first portion 116 may penetrate the passivation film 110. That is, the passivation film 110 may wrap the first portion 116. A bottom surface 116*bs* of the first portion 116 is exposed by the passivation film 110.

The second portion 117 is disposed on the first portion 116 and may be connected to the first portion 116. The second portion 117 may penetrate a part of the first mold layer 140. In other words, the first mold layer 140 may wrap the second portion 117.

In some example embodiments, the connecting pad 115 may include only the second portion 117 on the passivation film 110 without the first portion 116.

A second solder ball 236 may be disposed on the first portion 116 of the connecting pad 115. The second solder ball 236 may be disposed on the bottom surface 116*bs* of the first portion 116 of the connecting pad 115 exposed by the passivation film 110. The bottom surface 116*bs* of the first portion 116 of the connecting pad 115 may be in contact with the second solder ball 236. The second solder ball 236 may be electrically connected to the connecting pad 115. The arrangement and number of second solder balls 236 may vary.

The second solder ball 236 may include, for example, a substance of a solder material. For example, the second solder ball 236 may include, but is not limited to, at least one of lead (Pb), tin (Sn), indium (In), bismuth (Bi), antimony (Sb), silver (Ag), or alloys thereof.

Referring to FIG. 2*a*, a width W1 of the first portion 116 in the first direction DR1 may be smaller than a width (W1+W2+W3) of the second portion 117. The second portion 117 may protrude from both side walls of the first portion 116 opposite to each other in the first direction DR1. Therefore, the connecting pad 115 may have a T-shape. Here, the first direction DR1 may be a direction in which the passivation film 110 extends.

In the semiconductor package according to some example embodiments, the width (W1+W2+W3) of the second portion 117 in the first direction DR1 may be the same or substantially similar as it goes away from the second solder ball 236.

A length W2 at which the second portion 117 protrudes from one side wall of the first portion 116 may be, for example, 5 μm. A length W3 at which the second portion 117 protrudes from the other side wall of the first portion 116 may be, for example, 5 μm. In some example embodiments, the length W2 at which the second portion 117 protrudes from one side wall of the first portion 116 may be different from the length W3 at which the second portion 117 protrudes from the other side wall of the first portion 116.

The width W1 of the first portion 116 in the first direction DR1 may be, for example, 10 μm or more and 1 mm or less.

A height H1 of the first portion 116 in the second direction DR2 may be, for example, 1 μm or more and 30 μm or less. A height H2 of the second portion 117 in the second direction DR2 may be, for example, 1 μm or more and 30 μm or less. Here, the second direction DR2 may be a direction that intersects the first direction DR1. The second direction DR2 may be in a thickness direction of the passivation film 110.

Referring to FIG. 2*b*, in a semiconductor package according to an example embodiment, the width of the first portion 116 in the first direction DR1 may increase as it goes away from the second solder ball 236. The side wall of the first portion 116 may be tapered.

Referring to FIG. 1 again, the element 130 may be disposed on the connecting pad 115. The element 130 may be disposed on the second portion 117 of the connecting pad 115. At least a part of the element 130 may overlap the first semiconductor chip 200 to be described below in the second direction DR2. The number of elements may vary.

In some example embodiments, the element 130 may be a passive element. For example, the element 130 may be a capacitor.

The adhesive layer 137 may be disposed between the passivation film 110 and the element 130. The adhesive layer 137 may fill up the space between the connecting pads 115 spaced in the first direction DR1, and the space between passivation film 110 and the element 130. The element 130 may adhere to the passivation film 110 by the adhesive layer 137.

The adhesive layer 137 is not particularly limited as long as it attaches the element 130 onto the passivation film 110, and may include, for example, a non-conductive substance or a resin.

The element pad 135 may be disposed on the element 130. The element pad 135 may electrically connect the element 130 and the first wiring structure 120.

A post 125 may be disposed on the connecting pad 115. The post 125 may be disposed on the second portion 117 of the connecting pad 115. The post 125 may be in contact with the second portion 117 of the connecting pad 115. The post 125 may be electrically connected to the connecting pad 115. A plurality of posts 125 may be spaced apart from each other. The element 130 may be disposed between the posts 125.

The post 125 may include, for example, copper (Cu), nickel (Ni), titanium (Ti), titanium tungsten (TiW), titanium nitride (TiN), tantalum (Ta), tantalum nitride (TaN), chromium (Cr), aluminum (Al) or a combination thereof.

The first mold layer 140 may be disposed on the passivation film 110. The first mold layer 140 may wrap the second portion 117 of the connecting pad 115, the post 125, the element 130, and the element pad 135. That is, the post 125 may penetrate the first mold layer 140. The first mold layer 140 may cover the element 130, and the element pad 135 may penetrate the first mold layer 140.

An upper surface of the first mold layer 140 may be disposed on the same plane as the upper surface of the post 125 and/or the upper surface of the element pad 135.

The first mold layer 140 may include, but is not limited to, for example, an epoxy molding compound (EMC) or two or more types of silicone hybrid substrates.

The first wiring structure 120 may be disposed on the first mold layer 140. The first wiring structure 120 may include a plurality of first insulating layers 121 and a plurality of first wiring patterns 122, 123 and 124.

A plurality of first insulating layers 121 may be stacked on the first mold layer 140. The first insulating layer 121 may cover the first wiring patterns 122, 123 and 124. The number of first insulating layers 121 may vary.

The first insulating layer 121 may include an insulating substance. The first insulating layer 121 may include, for example, but is not limited to, silicon oxide, silicon nitride or a polymer. Each of the plurality of first insulating layers 121 may include the same substance or different substances from each other.

The first wiring patterns 122, 123, and 124 may penetrate the first insulating layer 121 and may be in contact with the element pad 135. Some of the first wiring patterns 122, 123, and 124 may be electrically connected to the element pad 135. Some of the first wiring patterns 122, 123 and 124 may be contact with the post 125. Some of the first wiring patterns 122, 123, and 124 may penetrate the first insulating layer 121 and may be electrically connected to the post 125. Some of the first wiring patterns 122, 123 and 124 may be electrically connected to the connecting pad 115 through the post 125.

The first wiring pattern 122, 123 and 124 may include the first wiring layers 122 and 124 and the first wiring via 123. It goes without saying that the number, position, and arrangement of the first wiring patterns 122, 123, and 124 may vary.

The first wiring layers 122 and 124 may extend along the upper surface of the first insulating layer 121. The first wiring via 123 may penetrate the first insulating layer 121 and connect the first wiring layers 122 disposed at different levels to each other. The first wiring layer 124 disposed at the uppermost part may be exposed by the first insulating layer 121.

The width of the first wiring via 123 may increase, for example, as it goes away from the first mold layer 140.

The first wiring patterns 122, 123 and 124 may include, for example, a conductive substance. Accordingly, the first wiring patterns 122, 123, and 124 may redistribute the chip pad 224 of the first semiconductor chip 200, as described below.

The first wiring patterns 122, 123 and 124 may perform various functions depending on the design of that layer. For example, the first wiring patterns 122, 123 and 124 may include a ground pattern, a power pattern, a signal pattern, and the like. The signal pattern may input and output, for example, various electric signals (e.g., data electric signals) except a ground signal, a power signal and the like.

The first wiring patterns 122, 123 and 124 may include, for example, but are not limited to, at least one of copper (Cu), aluminum (Al), silver (Ag), tin (Sn), gold (Au), nickel (Ni), lead (Pb), titanium (Ti) or alloys thereof.

The first semiconductor chip 200 may be disposed on the first wiring structure 120. The first semiconductor chip 200 may overlap at least a part of the element 130 in the second direction DR2.

The first semiconductor chip 200 may be an integrated circuit (IC) in which hundreds to millions or more of semiconductor elements are integrated in a single chip. For example, the first semiconductor chip 200 may be, but is not limited to, an application processor (AP) such as a CPU (Central Processing Unit), a GPU (Graphic Processing Unit), an FPGA (Field-Programmable Gate Array), a digital signal processor, an encryption processor, a micro processor, or a micro controller. For example, the first semiconductor chip 200 may be a logic chip such as an ADC (Analog-Digital Converter) or an ASIC (Application-Specific IC), and may be a memory chip such as a volatile memory (e.g., a DRAM) or a non-volatile memory (e.g., a ROM or a flash memory). In some example embodiments, the first semiconductor chip 200 may be configured by combining these elements with each other.

A chip pad 224 may be disposed on the lower surface of the first semiconductor chip 200. The chip pad 224 may be electrically connected to an electric circuit (e.g., a circuit pattern) in the first semiconductor chip 200. The chip pad 224 may include, for example, but is not limited to, aluminum (Al). An insulating layer surrounding the chip pad 224 may be further included on the lower surface of the first semiconductor chip 200. The lower surface of the chip pad 224 may be exposed by the insulating layer.

The first solder ball 226 may be disposed between the chip pad 224 and the first wiring layer 124, which is disposed at the uppermost part of the first wiring structure 120. The first solder ball 226 may be in contact with the chip pad 224 and the first wiring layer 124. The first semiconductor chip 200 is electrically connected to the first wiring structure 120. The arrangement and number of first solder balls 226 may vary.

A first underfill substance layer 228 may fill up the space between the first semiconductor chip 200 and the first wiring structure 120. The first underfill substance layer 228 may wrap the first solder balls 226 and fill up the space between the first solder balls 226.

The second mold layer 150 may be disposed on the first wiring structure 120. The second mold layer 150 may cover the first wiring structure 120. The second mold layer 150 may wrap the first semiconductor chip 200 and the first underfill substance layer 228. The upper surface of the second mold layer 150 may be disposed on the same plane as the upper surface of the first semiconductor chip 200. The upper surface of the first semiconductor chip 200 may be exposed by, for example, but is not limited to, the second mold layer 150. In some example embodiments, the second mold layer 150 may cover the upper surface of the first semiconductor chip 200.

The second mold layer 150 may include, but is not limited to, for example, an epoxy molding compound (EMC) or two or more types of silicone hybrid substrates.

When the element is disposed on the wiring structure to be spaced apart from the semiconductor chip, the semiconductor chip and the element are electrically connected through the wiring structure. At this time, the path between the semiconductor chip and the element becomes longer, the resistance increases, and the power transfer capability deteriorates. Further, because there is a need for a region for attaching the element on the wiring structure, the size of the wiring structure increases. Accordingly, the number of net dies on one wafer decreases, and the yield decreases.

In a semiconductor package according to some example embodiments, the element 130 is disposed between the posts 125 inside the first mold layer 140 below the first wiring structure 120. Because the element 130 is electrically connected to the first semiconductor chip 200 through the first wiring structure 120, the distance between the first semiconductor chip 200 and the element 130 may decrease. The power transfer capability is improved or enhanced accordingly. Further, because there is no size increase of the first wiring structure 120 due to the element 130, the yield is improved.

On the other hand, when the element is disposed in the lower part of the wiring structure, the solder ball may not be attached to the lower part of the wiring structure that overlaps the element, due to the presence of the element. Accordingly, the number of solder balls decreases, and a power loss occurs. To attach the solder ball, an additional wiring structure that includes a wiring pattern may be desired on the lower surface of the element.

In the semiconductor package according to some example embodiments, a T-shaped connecting pad 115 may be formed on the lower surface of the element 130. Therefore, because the second solder ball 236 may also be attached to the lower part of the element 130, power loss may be reduced or prevented. Further, because the second solder ball 236 is attached through the connecting pad 115 of a single layer without a plurality of wiring layers, the size of the semiconductor package may decrease, the manufacturing process may be further simplified, and the manufacturing cost may decrease.

Figure 3:
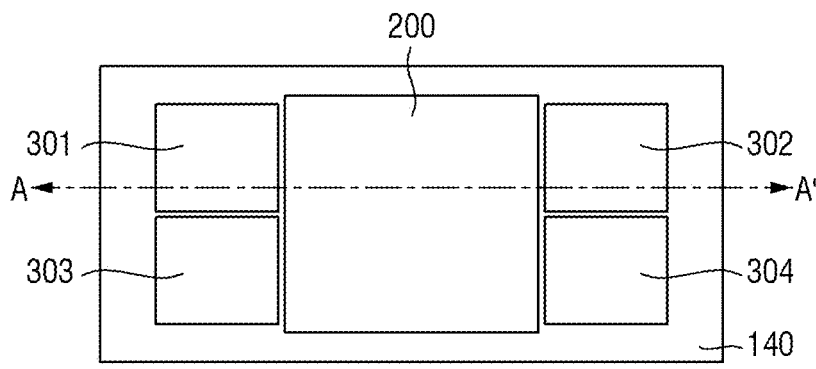
FIG. 3 is a schematic layout diagram for explaining the semiconductor package according to an example embodiment.
Figure 4:
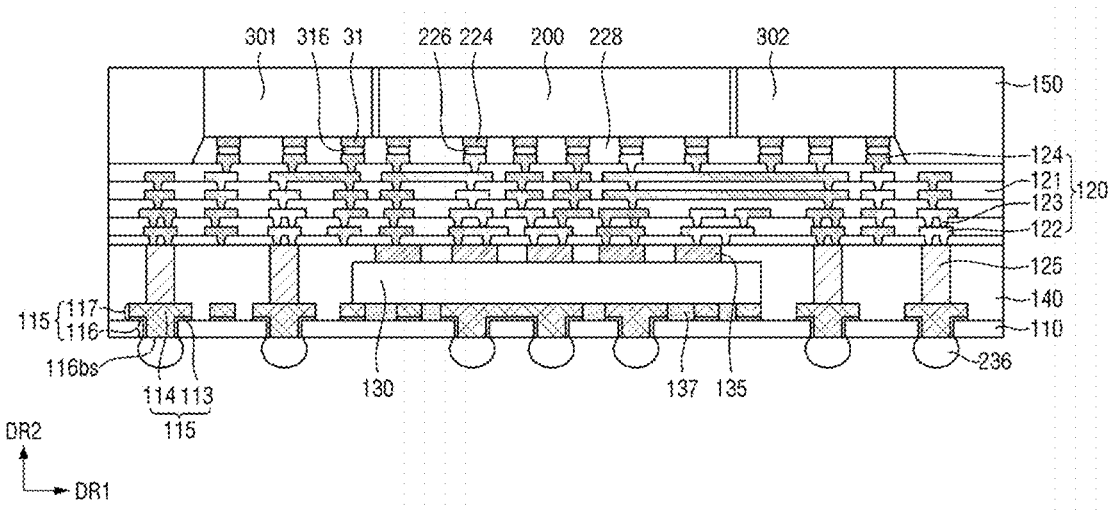
FIG. 4 is a cross-sectional view taken along a line A-A' of FIG. 3.
Figure 5:
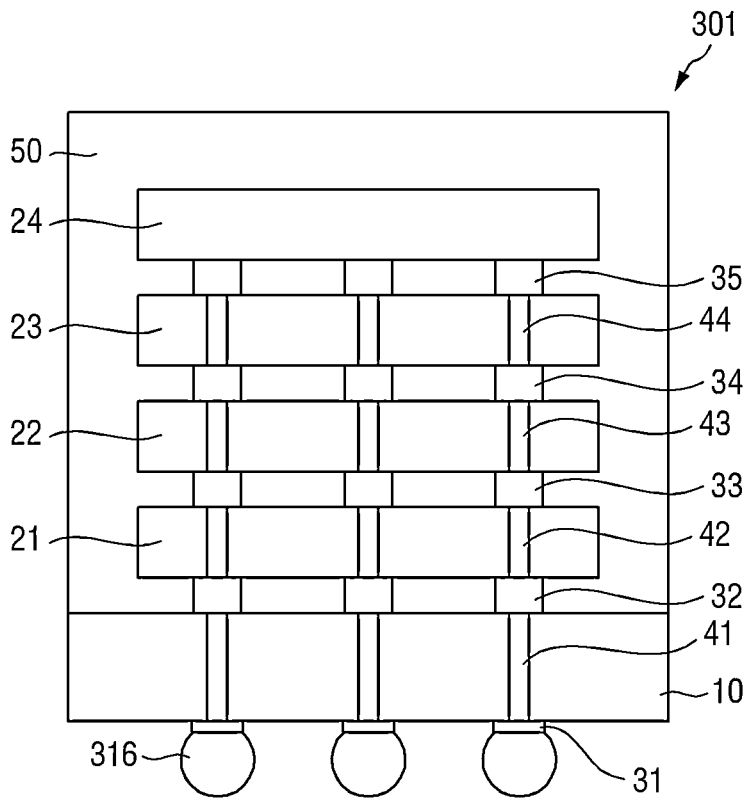
FIG. 5 is a diagram for explaining a first memory package of FIG. 4.

FIG. 3 is a schematic layout diagram for explaining the semiconductor package according to an example embodiment. FIG. 4 is a cross-sectional view taken along the line A-A' of FIG. 3. FIG. 5 is a diagram for explaining the first memory package 301 of FIG. 4. For convenience of explanation, repeated parts of contents explained above using FIGS. 1 and 2 will be briefly described or omitted.

Referring to FIG. 3, the semiconductor package according to an example embodiment may include a first semiconductor chip 200, and first to fourth memory packages 301, 302, 303 and 304. The first memory package 301 and the third memory package 303 may be disposed on one side of the first semiconductor chip 200, and the second memory package 302 and the fourth semiconductor chip 304 may be disposed on the other side of the first semiconductor chip 200.

For example, the first semiconductor chip 200 may be an ASIC such as a GPU, and the first to fourth memory packages 301, 302, 303 and 304 may be a stack memory such as a high bandwidth memory (HBM). Such a stack memory may be in the form in which a plurality of integrated circuits are stacked. The stacked integrated circuits may be electrically connected to each other through a TSV (Through Silicon Via) or the like.

For example, referring to FIG. 5, the first memory package 301 may include a buffer semiconductor chip 10, first to fourth memory semiconductor chips 21, 22, 23 and 24, first to fifth connecting terminals 31, 32, 33, 34 and 35, first to fourth through vias 41, 42, 43 and 44, and a third mold layer 50.

The buffer semiconductor chip 10 may be disposed at the lowermost part of the first memory package 301.

The first to fourth memory semiconductor chips 21, 22, 23 and 24 may be sequentially stacked on the buffer semiconductor chip 10. Although FIG. 5 shows that four memory semiconductor chips are stacked on the buffer semiconductor chip 10, the technical idea (or example embodiments) of the present disclosure is not limited thereto. That is, the number of memory semiconductor chips stacked on the buffer semiconductor chip 10 is not limited.

Each of the first to fourth memory semiconductor chips 21, 22, 23 and 24 may be, for example, a volatile memory semiconductor chip such as a DRAM (Dynamic Random Access Memory) or a SRAM (Static Random Access Memory), or a non-volatile memory semiconductor chip such as a PRAM (Phase-change Random Access Memory), a MRAM (Magnetoresistive Random Access Memory), a FeRAM (Ferroelectric Random Access Memory) or a RRAM (Resistive Random Access Memory). However, the technical idea (or inventive concepts) of the present disclosure is not limited thereto.

A first connecting terminal 31 may be disposed on a lower surface of the buffer semiconductor chip 10. The first connecting terminal 31 may include a conductive substance. The first connecting terminal 31 may be electrically connected to the third solder ball 316.

A second connecting terminal 32 may be disposed between the buffer semiconductor chip 10 and the first memory semiconductor chip 21. A third connecting terminal 33 may be disposed between the first memory semiconductor chip 21 and the second memory semiconductor chip 22. A fourth connecting terminal 34 may be disposed between the second memory semiconductor chip 22 and the third memory semiconductor chip 23. A fifth connecting terminal 35 may be disposed between the third memory semiconductor chip 23 and the fourth memory semiconductor chip 24. Each of the second to fifth connecting terminals 32, 33, 34 and 35 may include a conductive substance.

A first through via 41 may be disposed to penetrate the buffer semiconductor chip 10 in the second direction DR2. The first through via 41 may be connected to a corresponding pair of the first connecting terminal 31 and the second connecting terminal 32.

A second through via 42 may be disposed to penetrate the first memory semiconductor chip 21 in the second direction DR2. The second through via 42 may be connected to a corresponding pair of the second connecting terminal 32 and the third connecting terminal 33.

A third through via 43 may be disposed to penetrate the second memory semiconductor chip 22 in the second direction DR2. The third through via 43 may be connected to a corresponding pair of the third connecting terminal 33 and the fourth connecting terminal 34.

The fourth through via 44 may be disposed to penetrate the third memory semiconductor chip 23 in the second direction DR2. The fourth through via 44 may be connected to a corresponding pair of the fourth connecting terminal 34 and the fifth connecting terminal 35.

A conductive through electrode may be disposed inside each of the first to fourth through vias 41, 42, 43, and 44. The through electrode may include, for example, but is not limited to, at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), telium (Te), titanium (Ti), tungsten (W), zinc (Zn), or zirconium (Zr).

The first to fourth memory semiconductor chips 21, 22, 23 and 24 may be electrically connected to the buffer semiconductor chip 10 through second to fifth connecting terminals 32, 33, 34 and 35 and second to fourth through vias 42, 43 and 44.

The third mold layer 50 may be disposed to cover the first to fourth memory semiconductor chips 21, 22, 23 and 24 on the upper surface of the buffer semiconductor chip 10. The third mold layer 50 may also be disposed between the buffer semiconductor chip 10 and the first memory semiconductor chip 21, between the first memory semiconductor chip 21 and the second memory semiconductor chip 22, between the second memory semiconductor chip 22 and the third memory semiconductor chip 23, and between the third memory semiconductor chip 23 and the fourth memory semiconductor chip 24.

The third mold layer 50 may include, for example, an epoxy molding compound (EMC) or two or more types of silicone hybrid substrates.

The second to fourth memory packages 302, 303, 304, and 305 may have the structure same as or substantially similar to that of the first memory package 301 described above, but example embodiments of the present disclosure are not limited thereto. That is, in some other example embodiments, at least one of the second to fourth memory packages 302, 303, 304 and 305 may have a structure different from that of the first memory package 301.

Referring to FIGS. 3 and 4, the third solder ball 316 may be contact with the first wiring layer 124. The first to fourth memory packages 301, 302, 303 and 304 may be electrically connected to the first wiring structure 120. The first wiring patterns 122, 123 and 124 may redistribute the first connecting terminal 31 of the first to fourth memory packages 301, 302, 303 and 304.

The first underfill substance layer 228 may fill up the space between the first to fourth memory packages 301, 302, 303 and 304 and the first wiring structure 120. The first underfill substance layer 228 may wrap the first solder ball 226 and the third solder ball 316 and fill up the space between the second and third solder balls 226 and 316.

In some example embodiments, the first underfill substance layer 228 between the first to fourth memory packages 301, 302, 303 and 304 and the first wiring structure 120 may be separated from the first underfill substance layer 228 between the first semiconductor chip 200 and the first wiring structure 120.

The second mold layer 150 may cover the first to fourth memory packages 301, 302, 303 and 304. The upper surface of the second mold layer 150 may be disposed on the same plane as the upper surfaces of the first to fourth memory packages 301, 302, 303 and 304. The upper surfaces of the first to fourth memory packages 301, 302, 303 and 304 may be exposed by, for example, the second mold layer 150, but example embodiments of the present disclosure are not limited thereto. In some example embodiments, the second mold layer 150 may cover the upper surfaces of the first to fourth memory packages 301, 302, 303 and 304.

Figure 6:
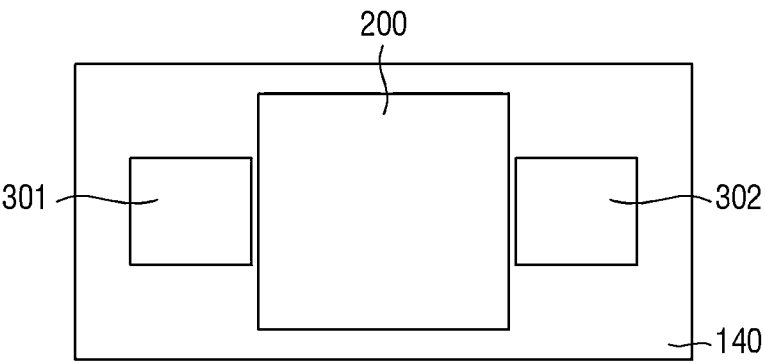
FIGS. 6 and 7 are schematic layout diagrams for explaining semiconductor packages according to some example embodiments.
Figure 7:
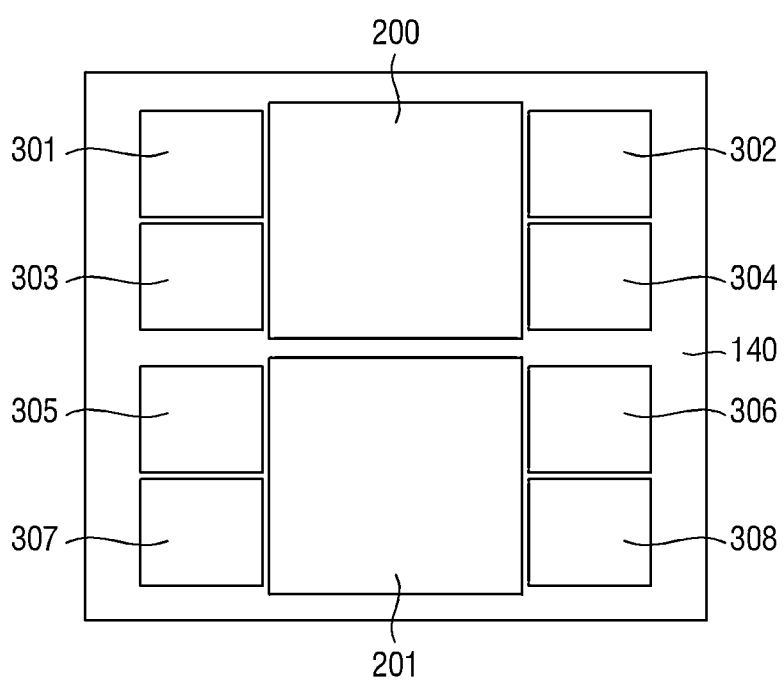

FIGS. 6 and 7 are schematic layout diagrams for explaining semiconductor packages according to some example embodiments. For convenience of explanation, repeated parts of contents explained above using FIGS. 3 to 5 will be briefly described or omitted.

Referring to FIG. 6, the semiconductor package according to an example embodiment may include a first semiconductor chip 200, and first and second memory packages 301 and 302. The first semiconductor chip 200 may be disposed between the first and second memory packages 301 and 302.

Referring to FIG. 7, the semiconductor package according to an example embodiment may include a first semiconductor chip 200, first to fourth memory packages 301, 302, 303 and 304, a second semiconductor chip 201, and fifth to eighth memory packages 305, 306, 307 and 308.

The second semiconductor chip 201 may be spaced apart from the first semiconductor chip 200. A fifth memory package 305 and a sixth memory package 306 may be disposed on one side of the second semiconductor chip 201, and a seventh memory package 307 and an eighth semiconductor chip 308 may be disposed on the other side of the second semiconductor chip 201.

The fifth to eighth memory packages 305, 306, 307, and 308 may have structures same as or substantially similar to that of the first memory package 301 described above, but example embodiments of the present disclosure are not limited thereto. That is, in some other example embodiments, at least one of the fifth to eighth memory packages 305, 306, 307 and 308 may have different structures from that of the first memory package 301.

Figure 8:
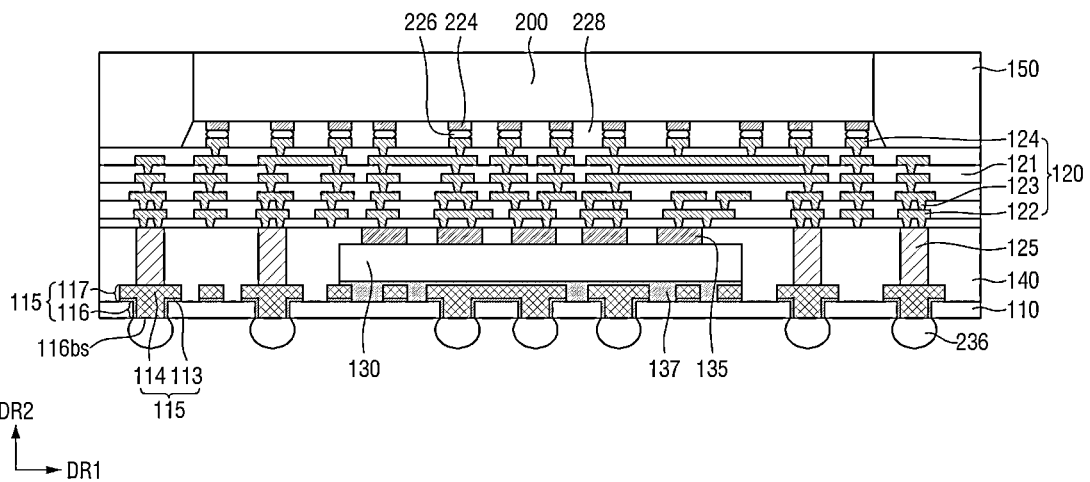
FIG. 8 is a diagram for explaining a semiconductor package according to an example embodiment.

FIG. 8 is a diagram for explaining a semiconductor package according to an example embodiment. For convenience of explanation, repeated parts of contents explained above using FIGS. 1 and 2 will be briefly described or omitted.

Referring to FIG. 8, in the semiconductor package according to an example embodiment, the adhesive layer 137 may be disposed between the element 130, the passivation film 110 and the connecting pad 115. The adhesive layer 137 may extend along the lower surface of the element 130. The element 130 may adhere to the connecting pad 115 and the passivation film 110 by the adhesive layer 137.

Figure 9:
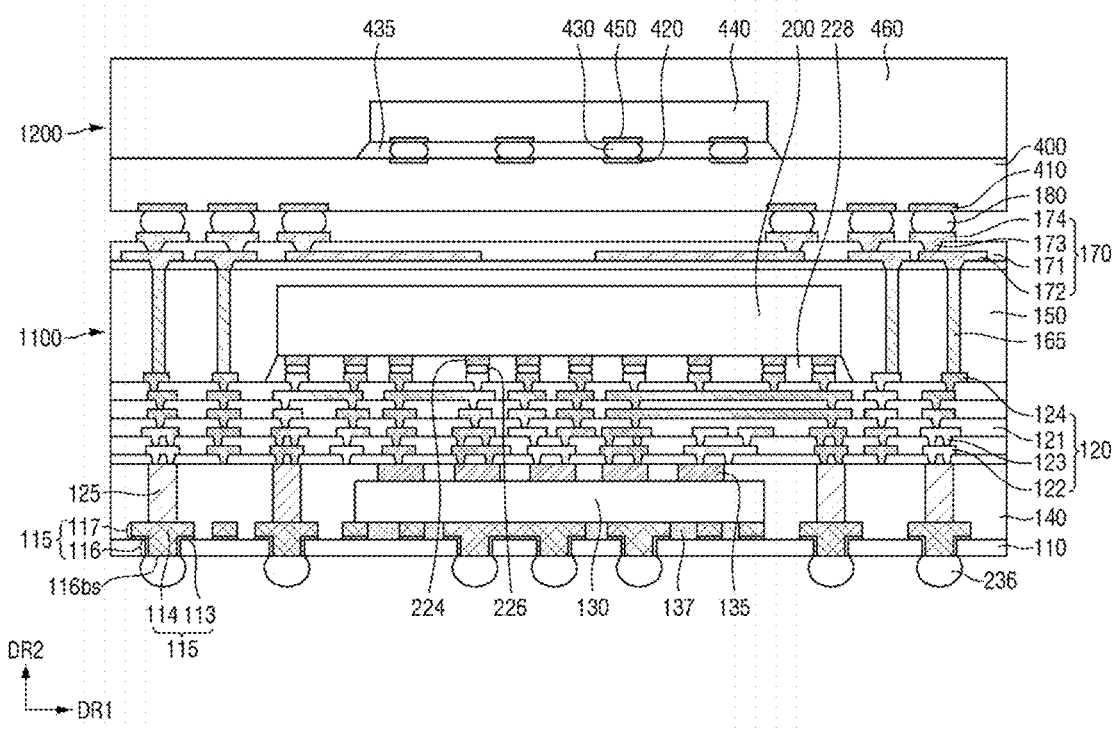
FIG. 9 is a diagram for explaining a semiconductor package according to an example embodiment.

FIG. 9 is a diagram for explaining a semiconductor package according to an example embodiment. For convenience of explanation, repeated parts of contents explained above using FIGS. 1 and 2 will be briefly described or omitted.

Referring to FIG. 9, the semiconductor package according to an example embodiment may include a first semiconductor package 1100 and a second semiconductor package 1200.

The first semiconductor package 1100 may further include a through via 165 and a second wiring structure 170 in any one of the semiconductor packages shown in FIGS. 1 to 8.

The second mold layer 150 may cover the first semiconductor chip 200. The through via 165 may penetrate the second mold layer 150.

The through via 165 may be disposed on the first wiring structure 120. The first semiconductor chip 200 may be disposed between the through vias 165. The through via 165 may be disposed on the first wiring layer 124 of the first wiring structure 120. The through via 165 may be contact with the first wiring layer 124. The through via 165 may be electrically connected to the first wiring layer 124.

The second wiring structure 170 may be disposed on the second mold layer 150. The second wiring structure 170 may include a plurality of second insulating layers 171 and a plurality of second wiring patterns 172, 173, and 174.

The second insulating layer 171 may include an insulating substance. The second insulating layer 171 may include, for example, but is not limited to, silicon oxide, silicon nitride or a polymer. Each of the plurality of second insulating layers 171 may include the same substance as each other, or may include different substances from each other.

The second wiring patterns 172, 173 and 174 penetrate the second insulating layer 171 and may be in contact with the through via 165. The second wiring patterns 172, 173 and 174 may be electrically connected to the through via 165.

The second wiring pattern 172, 173 and 174 may include the second wiring layers 172 and 174 and the second wiring via 173. It goes without saying that the number and position, and arrangement of the second wiring patterns 172, 173, and 174 may vary.

The second wiring layers 172 and 174 may extend along the upper surface of the second insulating layer 171. The second wiring via 173 may penetrate the second insulating layer 171 to connect the second wiring layers 172 disposed at different levels to each other. The second wiring layer 174 disposed at the uppermost part may be exposed by the second insulating layer 171.

The width of the second wiring via 173 may increase, for example, as it goes away from the first mold layer 140.

The second wiring pattern 172, 173 and 174 may include, for example, a conductive substance. Accordingly, the second wiring patterns 172, 173 and 174 may redistribute the chip pad 224 of the first semiconductor chip 200.

The second semiconductor package 1200 may include a substrate 400, a third semiconductor chip 440, a second underfill substance layer 435, and a fourth mold layer 460.

The substrate 400 may be, for example, a printed circuit board (PCB) or a ceramic substrate. In some example embodiments, the substrate 311 may be an interposer.

The substrate 400 may include a lower pad 410 and an upper pad 420. The lower pad 410 may be disposed on the lower surface of the substrate 400, and the upper pad 420 may be disposed on the upper surface of the substrate 400.

The third semiconductor chip 440 may be disposed on the substrate 400. The third semiconductor chip 440 may include, for example, but is not limited to, one semiconductor chip. In some other example embodiments, the third semiconductor chip 440 may be a semiconductor package including a plurality of semiconductor chips.

A chip pad 450 may be disposed on the lower surface of the third semiconductor chip 440. A fourth solder ball 430 may be disposed between the chip pad 450 and the upper pad 420. The fourth solder ball 430 may be in contact with the chip pad 450 and the upper pad 420. The third semiconductor chip 440 may be electrically connected to the substrate 400. The arrangement and number of fourth solder balls 430 may vary.

The second underfill substance layer 435 may fill up the space between the substrate 400 and the third semiconductor chip 440. The second underfill substance layer 435 may wrap the fourth solder ball 430 and fill up the space between the fourth solder balls 430.

The fourth mold layer 460 may be disposed on the substrate 400. The fourth mold layer 460 may cover the third semiconductor chip 440. The fourth mold layer 460 may wrap the third semiconductor chip 440. In some example embodiments, the upper surface of the third semiconductor chip 440 may be exposed by the fourth mold layer 460.

The fourth mold layer 460 may include, for example, but is not limited to, an epoxy molding compound (EMC) or two or more types of silicone hybrid substrates.

A fifth solder ball 180 may be disposed between the first semiconductor package 1100 and the second semiconductor package 1200. The fifth solder ball 180 may be in contact with the second wiring layer 174 and the lower pad 410. The first semiconductor package 1100 and the second semiconductor package 1200 may be electrically connected through the fifth solder ball 180. The arrangement and number of fifth solder balls 180 may vary.

Figure 10:
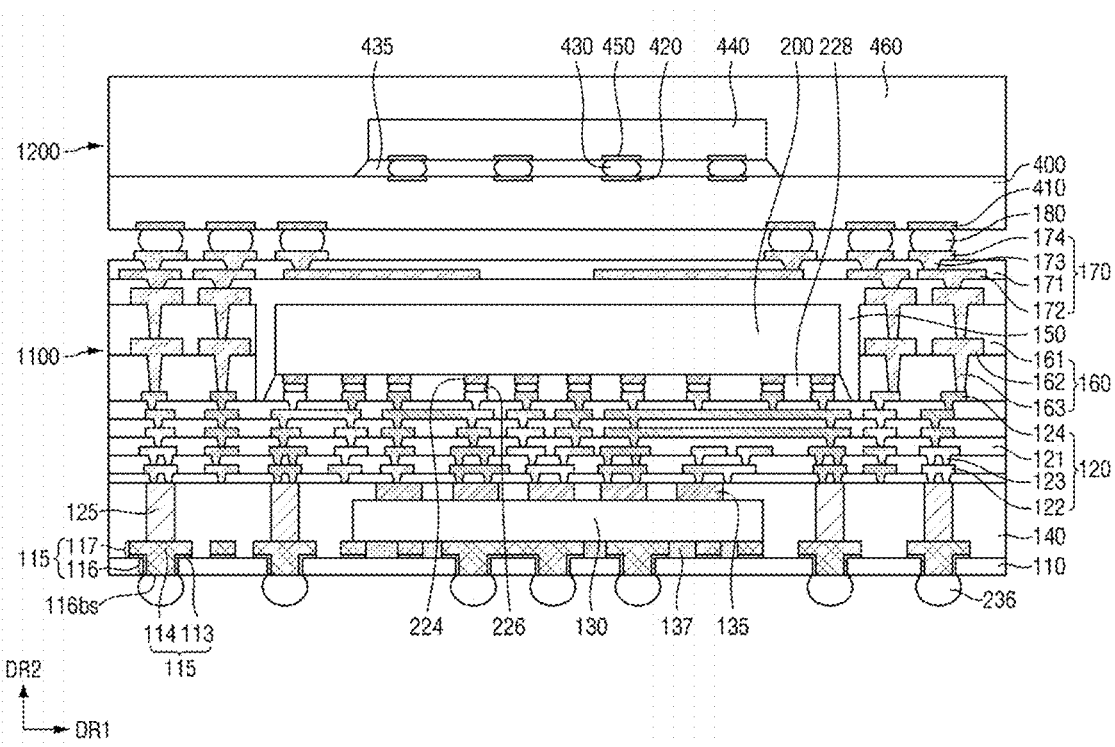
FIG. 10 is a diagram for explaining the semiconductor package according to an example embodiment.

FIG. 10 is a diagram for explaining a semiconductor package according to an example embodiment. For convenience of explanation, repeated parts of contents explained above using FIG. 9 will be briefly described or omitted.

Referring to FIG. 10, in the semiconductor package according to an example embodiment, the first semiconductor package 1100 may include a frame 160 instead of a through via 165. The second mold layer 150 may wrap the frame 160. The frame 160 may penetrate the second mold layer.

The frame 160 may include a through hole (or an opening). The through hole may be disposed, for example, at the center of the frame 160. It goes without saying that the number, position or arrangement of the through holes may vary.

The through hole may expose at least a part of the upper surface of the first wiring structure 120. The first semiconductor chip 200 may be disposed inside the through hole.

The frame 160 may include a plurality of frame insulating layers 161 and a plurality of frame wiring patterns 162 and 163.

The frame insulating layer 161 may include an insulating substance. The frame insulating layer 161 may include, for example, an insulating substance such as a thermosetting resin (e.g., an epoxy resin) or a thermoplastic resin (e.g., polyimide), and may further include an inorganic filler. In some example embodiments, the frame insulating layer 161 may include a resin impregnated in a core material such as glass fiber (glass cloth, glass fabric) together with an inorganic filler (e.g., prepreg, ABF (Ajinomoto Build-up Film), or FR-4 and BT (Bismaleimide Triazine).

The frame wiring patterns 162 and 163 may include a frame wiring layer 162 and a frame via 163. It goes without saying that the number, position, and arrangement of the frame wiring patterns 162 and 163 may vary.

The frame wiring layer 162 may extend along the upper surface of the frame insulating layer 161. The frame via 163 may penetrate the frame insulating layer 161 to connect the frame wiring layers 162 disposed at different levels to each other. The frame wiring layer 162 disposed at the uppermost part may be exposed by the frame insulating layer 161. The frame wiring layer 162 disposed at the uppermost part may be disposed inside the second mold layer 150. The frame wiring layer 162 disposed at the uppermost part may be in contact with the second wiring via 173. The frame wiring patterns 162 and 163 may be electrically connected to the second wiring structure 170.

The first wiring layer 124 may be disposed inside the frame insulating layer 161. The frame via 163 may penetrate the frame insulating layer 161 and may be contact with the first wiring layer 164. The frame wiring patterns 162 and 163 may be electrically connected to the first wiring structure 120.

The width of the frame via 163 may increase, for example, as it goes away from the first mold layer 140.

The frame wiring patterns 162 and 163 may include, but are not limited to, least one of copper (Cu), aluminum (Al), silver (Ag), tin (Sn), gold (Au), nickel (Ni), lead (Pb), titanium (Ti), or alloys thereof.

FIGS. 11 to 20 are intermediate stage diagrams for explaining the method for manufacturing a semiconductor package according to an example embodiment.

Figure 11:
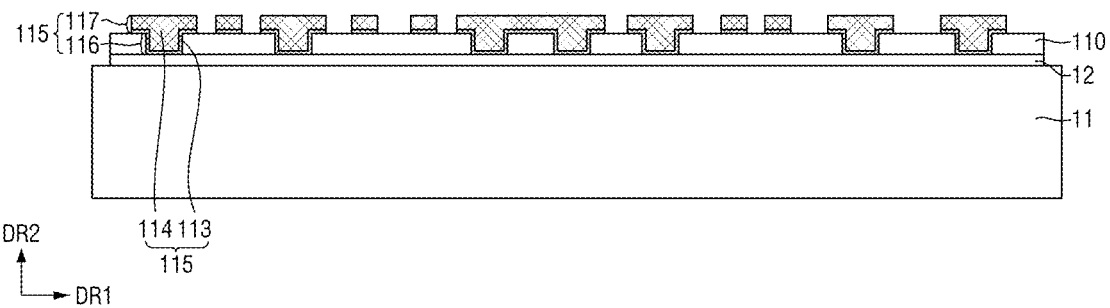
FIGS. 11 to 20 are intermediate stage diagrams for explaining a method for manufacturing a semiconductor package according to an example embodiment.

Referring to FIG. 11, the first carrier substrate 11 may be provided. The first carrier substrate 11 may include, for example, silicon, metal, glass, plastic, ceramic, and the like.

The passivation film 110 may be formed on the first carrier substrate 11. The passivation film 110 may include an opening that exposes at least a part of the upper surface of the first carrier substrate 11. The passivation film 110 may include a photo imageable dielectric. The side walls that define the opening of the passivation film 110 may be tapered by the process of forming the opening of the passivation film 110. That is, for example, the width of the opening included in the passivation film 110 may increase as it goes away from the first carrier substrate 11.

The first adhesive layer 12 may be further interposed between the first carrier substrate 11 and the passivation film 110. The first adhesive layer 12 may be, for example, a photosensitive adhesive.

Next, the barrier film 113 may be formed on the passivation film 110. The filling film 114 may be formed on the barrier film 113. Therefore, the connecting pad 115 including the barrier film 113 and the filling film 114 may be formed.

For example, a pre-barrier film extending along the profiles of the passivation film 110 and the first adhesive layer 12 may be formed on the passivation film 110. A pre-filling film that covers the passivation film 110 may be formed on the pre-barrier film. The barrier film and the filling film may be formed by patterning the pre-barrier film and the pre-filling film. Therefore, the barrier film 113 may extend between the passivation film 110 and the filling film 114. A connecting pad 115 that includes a first portion 116 disposed inside the passivation film 110 and a second portion 117 disposed on the first portion 116 may be formed. In other words, the connecting pad 115 has a T shape, which includes a first portion 116 that penetrated the passivation film 110 and a second portion 117 that is on the first portion 116 and penetrating a part of the second mold layer 140. In some example embodiments, each of the first portion 116 and the second portion 117 may include the barrier film 113 and the filling film 114.

Figure 12:
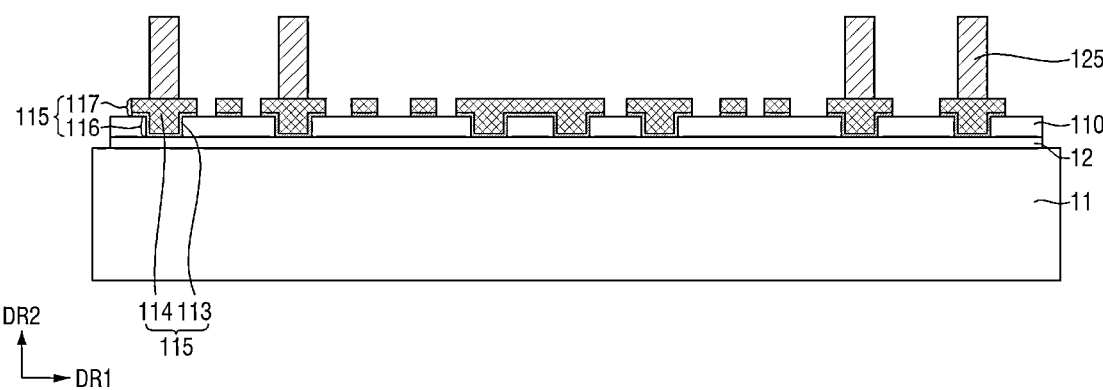

Referring to FIG. 12, the post 125 may be formed on the connecting pad 115. The post 125 may be formed on the second portion 117 of the connecting pad 115. The post 125 may come into contact with the second portion 117 of the connecting pad 112.

Figure 13:
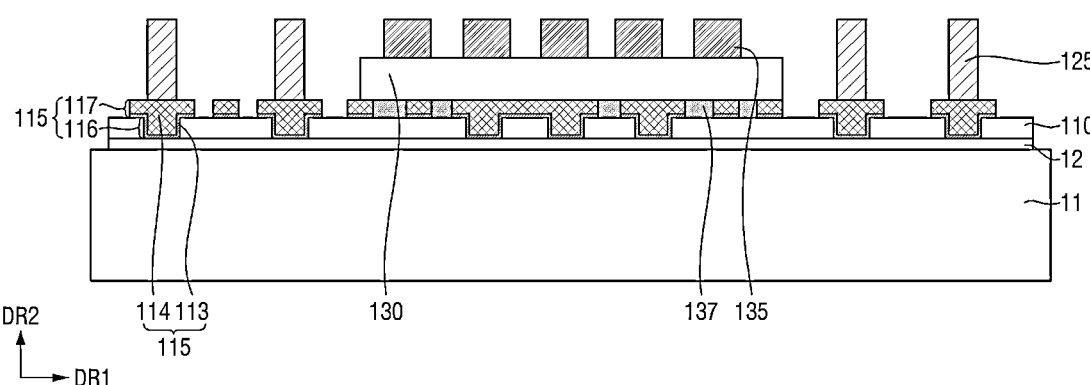

Referring to FIG. 13, the element 130 having the element pad 135 on the upper surface thereof may be mounted on the connecting pad 115. The element 130 may be disposed on the second portion 117 of the connecting pad 115. The element 130 may adhere to the passivation film 110 and the connecting pad 115 by the adhesive layer 137. The post 125 may ensure or guarantee the height at which the element 130 is disposed on the second portion 117 of the connecting pad 115.

Figure 14:
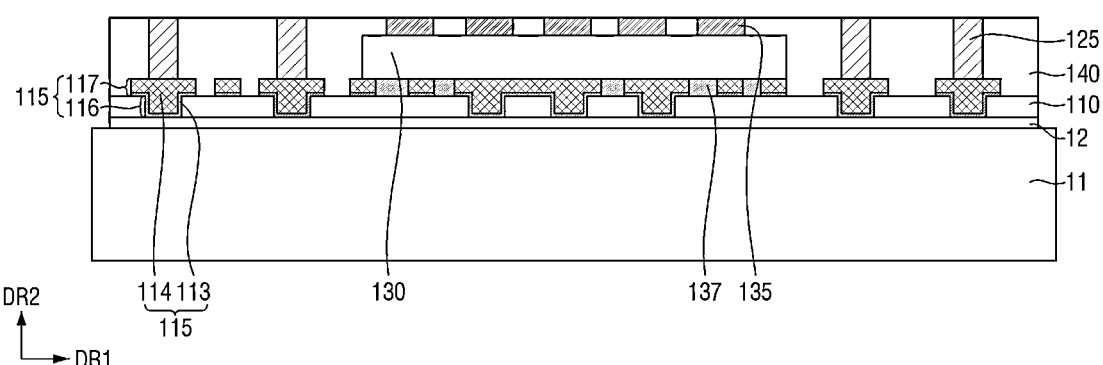

Referring to FIG. 14, the first mold layer 140 may be formed on the passivation film 110. The first mold layer 140 may cover the passivation film 110, the connecting pad 115, the post 125, the element 130, and the element pad 135.

Next, a flattening process (or planarization process) may be performed on the upper part of the first mold layer 140, the upper part of the post 125, and the upper part of the element pad 135. The upper part of the first mold layer 140, the upper part of the post 125, and the upper part of the element pad 135 may be grinded so that the upper surface of the first mold layer 140, the upper surface of the post 125, and the element pad the upper surface of 135 are on the same plane.

Figure 15:
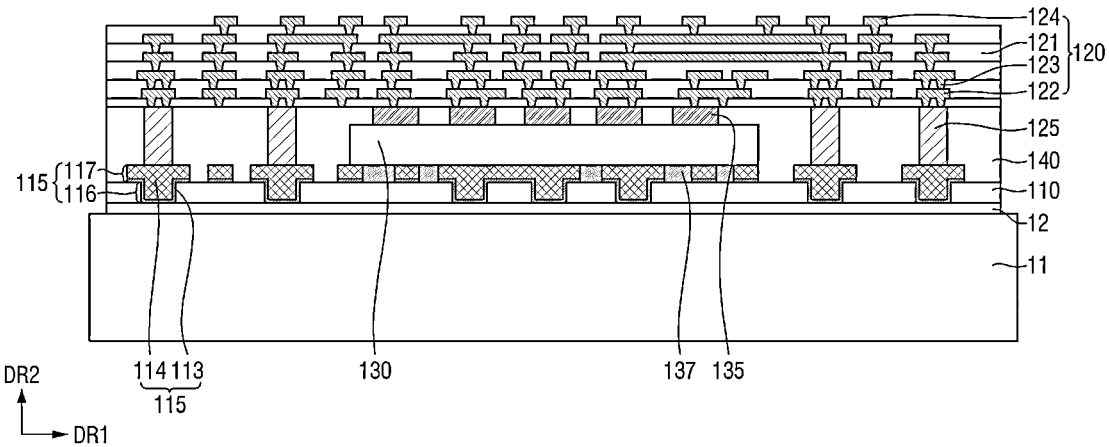

Referring to FIG. 15, the first wiring structure 120 may be formed on the first mold layer 140. The first insulating layer 121, the first wiring via 123, and the first wiring layers 122 and 124 may be formed on the first mold layer 140 to provide the first wiring structure 120.

The first wiring structure 120 may be formed through, for example, a re-distribution layer process (RDL), a damascene process, a dual damascene process or a back end of line process (BEOL).

Figure 16:
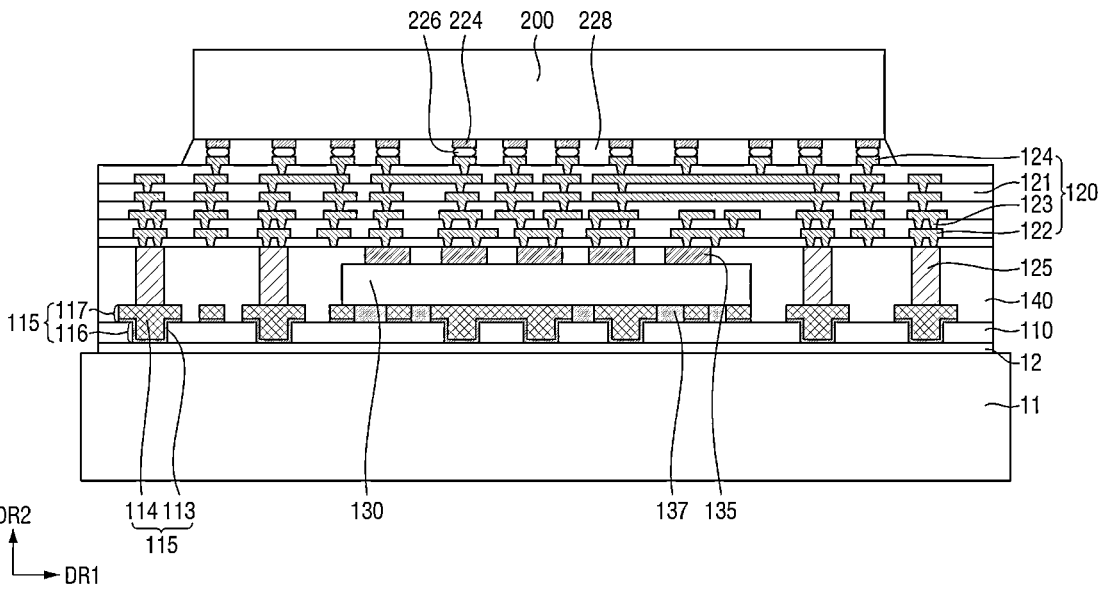

Referring to FIG. 16, the first semiconductor chip 200 may be mounted on the first wiring structure 120. The first solder ball 226 may be formed between the first wiring layer 124 disposed at the uppermost part of the first wiring structure 120 and the chip pad 224 of the first semiconductor chip 200. The first semiconductor chip 200 may be electrically connected to the first wiring structure 120 through the chip pad 224 and the first solder ball 226.

Subsequently, a first underfill substance layer 228 may be formed between the first semiconductor chip 200 and the first wiring structure 120.

Figure 17:
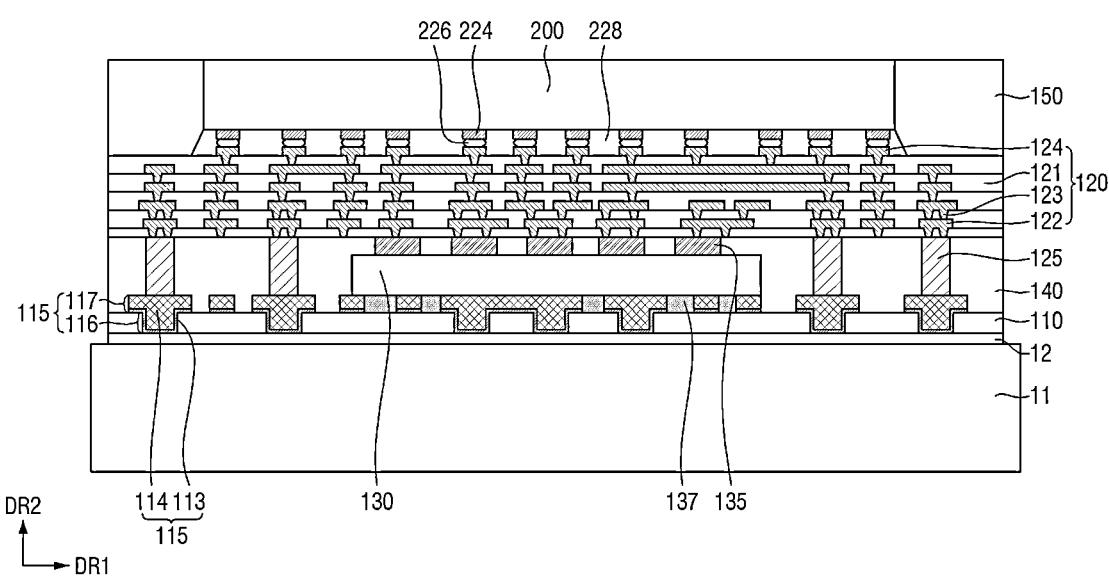

Referring to FIG. 17, a second mold layer 150 that covers the first semiconductor chip 200 may be formed on the first wiring structure 120. The second mold layer 150 may cover the first semiconductor chip 200 and the first underfill substance layer 228 on the first wiring structure 120.

Next, a flattening process (or a planarization process) may be performed on the second mold layer 150. Accordingly, the upper surface of the second mold layer 150 and the upper surface of the first semiconductor chip 200 may be disposed on the same plane.

Figure 18:
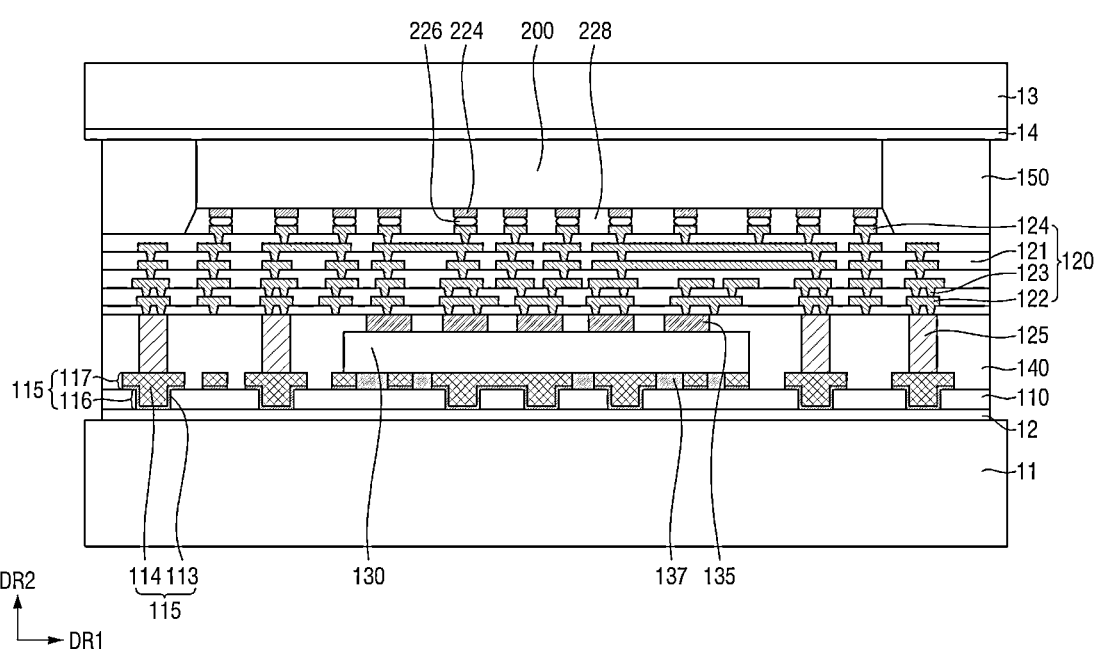

Referring to FIG. 18, the second carrier substrate 13 may be attached onto the first semiconductor chip 200 and the second mold layer 150. The second carrier substrate 13 may include, for example, silicon, metal, glass, plastic, ceramic, and the like.

A second adhesive layer 14 may be further interposed between the second carrier substrate 13, the first semiconductor chip 200, and the second mold layer 150. The second adhesive layer 14 may be, for example, a photosensitive adhesive.

Figure 19:
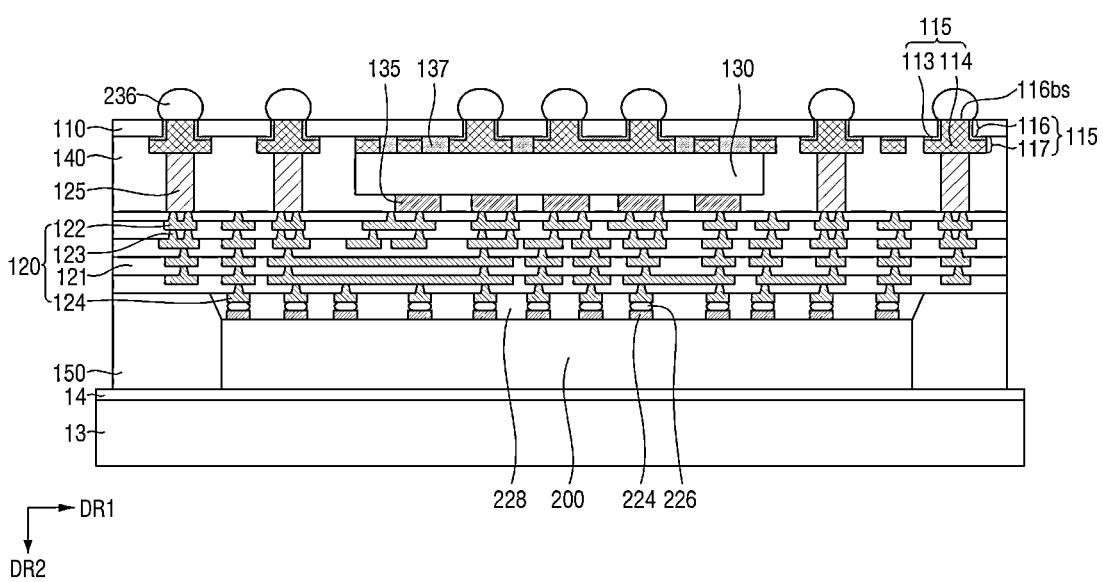

Referring to FIG. 19, the semiconductor package may be turned upside down. The first carrier substrate 11 may be disposed above the second carrier substrate 13 in the second direction DR2.

Next, the first carrier substrate 11 and the first adhesive layer 12 may be removed from the semiconductor package. Accordingly, the bottom surface 116bs of the second portion 117 of the connecting pad 115 may be exposed.

Next, the second solder ball 236 may be formed on the exposed bottom surface 116bs of the second portion 117. The second solder ball 236 may be electrically connected to the connecting pad 115.

Figure 20:
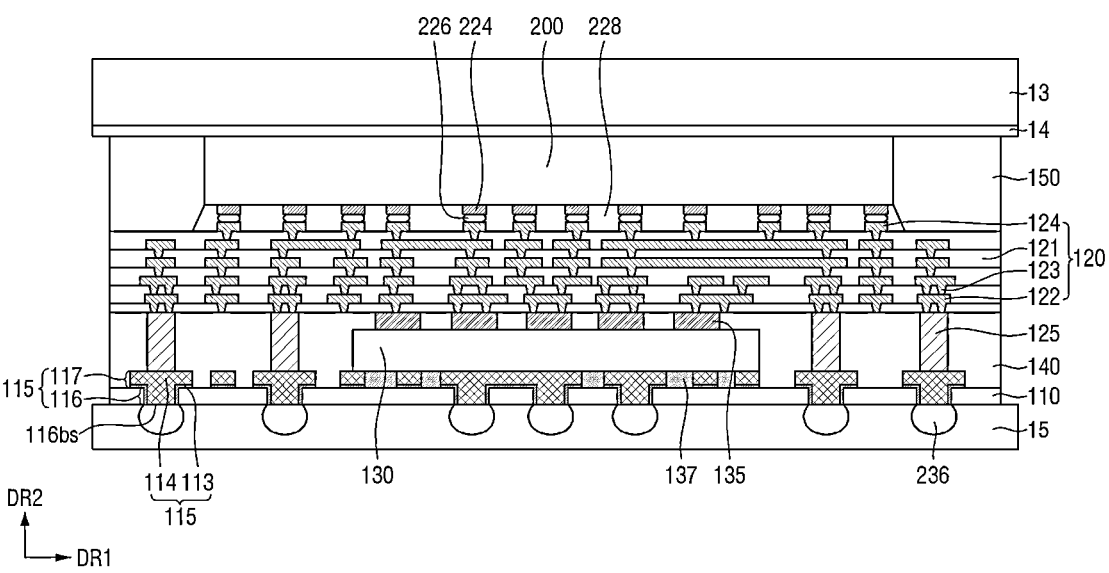

Referring to FIG. 20, a tape 15 may be attached onto the second solder ball 236 and the passivation film 110. After that, the semiconductor package may be turned upside down. The second carrier substrate 13 may be disposed above the tape 15 in the second direction DR2.

Next, referring to FIG. 1, after the semiconductor package is temporarily fixed to the tape 15, the second carrier substrate 13 and the second adhesive layer 14 may be removed. After that, the tape 15 may be removed from the semiconductor package.

In concluding the detailed description, those skilled in the art will appreciate that many variations and modifications may be made to the disclosed example embodiments without substantially departing from the principles of the present disclosure. Therefore, the disclosed example embodiments of the disclosure are used in a generic and descriptive sense only and not for purposes of limitation.

What is claimed is:

1. A semiconductor package comprising:
a passivation film;
a mold layer on the passivation film;
a connecting pad having a T shape, the T shape including a first portion and a second portion on the first portion, the first portion penetrating the passivation film, the second portion penetrating a part of the mold layer;
a solder ball on the first portion of the connecting pad;
an element in the mold layer and on the second portion of the connecting pad;
a wiring structure on the mold layer, the wiring structure including an insulating layer and a wiring pattern inside the insulating layer;
an element pad in the mold layer and on the element, the element pad electrically connected to the element and the wiring pattern; and
a semiconductor chip on the wiring structure,
wherein the first portion of the connecting pad is in contact with the solder ball, wherein the second portion of the connecting pad is in contact with the element, and
wherein a width of the second portion of the connecting pad in a first direction parallel to an upper surface of the passivation film is greater than a width of the first portion of the connecting pad in the first direction.

2. The semiconductor package of claim 1, wherein a lower surface of the passivation film is on a same plane as a lower surface of the first portion of the connecting pad.

3. The semiconductor package of claim 1, wherein the solder ball is not inside the passivation film.

4. The semiconductor package of claim 1, wherein
the connecting pad includes a barrier film and a filling film on the barrier film, and
each of the first portion and the second portion includes the barrier film and the filling film.

5. The semiconductor package of claim 4, wherein the barrier film extends between the filling film and the passivation film, and does not extend between the filling film and the solder ball.

6. The semiconductor package of claim 1, further comprising:
a post penetrating the mold layer and electrically connecting the connecting pad and the wiring pattern.

7. The semiconductor package of claim 1, wherein at least a part of the element overlaps the semiconductor chip in a second direction perpendicular to the upper surface of the passivation film.

8. The semiconductor package of claim 1, wherein
the wiring pattern including a wiring layer and a wiring via on the wiring layer, and
a width of the wiring via in the first direction increases as being away from the mold layer.

9. The semiconductor package of claim 8, wherein the width of the first portion of the connecting pad in the first direction increases as being away from the solder ball.

10. A semiconductor package comprising:
a connecting pad having a T shape, the T shape including a first portion and a second portion on the first portion;
a passivation film wrapping the first portion of the connecting pad;
a mold layer on the passivation film and wrapping the second portion of the connecting pad;
a wiring structure on the mold layer and including an insulating layer and a wiring pattern inside the insulating layer;
a post penetrating the mold layer and electrically connected to the second portion of the connecting pad and the wiring pattern;
an element in the mold layer and on the second portion of the connecting pad, the element including an element pad on an upper surface thereof, the element pad electrically connected to the wiring pattern; and
a solder ball on the first portion of the connecting pad,
wherein the first portion of the connecting pad is in contact with the solder ball,
wherein the second portion of the connecting pad is in contact with the element, and
wherein a width of the second portion of the connecting pad in a first direction parallel to an upper surface of the passivation film is greater than a width of the first portion of the connecting pad in the first direction.

11. The semiconductor package of claim 10, wherein
the wiring pattern including a wiring layer and a wiring via on the wiring layer,
a width of the wiring via in the first direction increases as being away from the mold layer, and
the width of the first portion of the connecting pad in the first direction increases as being away from the solder ball.

12. The semiconductor package of claim 10, wherein
the passivation film exposes a lower surface of the first portion of the connecting pad.

13. The semiconductor package of claim 10, further comprising:
an adhesive layer between the element and the passivation film.

14. The semiconductor package of claim 13, wherein the adhesive layer extends between the element and the connecting pad.

15. The semiconductor package of claim 10, wherein
the connecting pad includes a filling film and a barrier film between the filling film and the passivation film, and each of the first portion and the second portion includes the barrier film and the filling film.

16. A semiconductor package comprising:
a passivation film;
a first mold layer on the passivation film;
a connecting pad having a T shape, the T shape including a first portion and a second portion on the first portion, the first portion penetrating the passivation film, the second portion penetrating a part of the first mold layer on the first portion;
a first solder ball in contact with the first portion of the connecting pad;
an element on the second portion of the connecting pad;
an adhesive layer between the passivation film and the element;
an element pad in the first mold layer and on the element;
a first wiring structure on the first mold layer, the first wiring structure including a first insulating layer and a first wiring pattern inside the first insulating layer, the first wiring pattern electrically connected to the element pad;
a post penetrating the first mold layer and electrically connected to the first wiring pattern and the second portion of the connecting pad;
a first semiconductor chip on the first wiring structure and overlapping at least a part of the element;
a second solder ball between the first wiring structure and the first semiconductor chip; and
a second mold layer on the first wiring structure, the second mold layer covering the first wiring structure and the first semiconductor chip,
wherein the first portion of the connecting pad is in contact with the first solder ball,
wherein the second portion of the connecting pad is in contact with the element, and
wherein a width of the second portion of the connecting pad in a first direction parallel to an upper surface of the passivation film is greater than a width of the first portion of the connecting pad in the first direction.

17. The semiconductor package of claim 16, wherein the first wiring pattern including a first wiring layer and a first wiring via on the first wiring layer, a width of the first wiring via in the first direction increases as being away from the first mold layer, and
the width of the first portion of the connecting pad in the first direction increases as being away from the first solder ball.

18. The semiconductor package of claim 16, further comprising:
a second semiconductor chip spaced apart from the first semiconductor chip and on the first wiring structure, the second semiconductor chip being different from the first semiconductor chip; and
a third solder ball between the first wiring structure and the second semiconductor chip.

19. The semiconductor package of claim 16, further comprising:
a through via on the first wiring structure, the through via penetrating the second mold layer and electrically connected to the first wiring pattern;
a second wiring structure on the second mold layer, the second wiring structure including a second insulating layer and a second wiring pattern, the second wiring pattern electrically connected to the through via; and
a second semiconductor chip on the second wiring structure and electrically connected to the second wiring pattern.

20. The semiconductor package of claim 16, further comprising:
a frame on the first wiring structure and penetrating the second mold layer, the frame including a frame insulating layer and a frame wiring pattern inside the frame insulating layer, the frame wiring pattern electrically connected to the first wiring pattern;
a second wiring structure on the second mold layer, the second wiring structure including a second insulating layer and a second wiring pattern, the second wiring pattern electrically connected to the frame wiring pattern; and
a second semiconductor chip on the second wiring structure and electrically connected to the second wiring pattern.

* * * * *